(12) United States Patent
Nelson et al.

(10) Patent No.: US 11,333,907 B2
(45) Date of Patent: May 17, 2022

(54) OPTICAL ENGINE

(71) Applicant: ROCKLEY PHOTONICS LIMITED, London (GB)

(72) Inventors: David Arlo Nelson, Fort Collins, CO (US); Vivek Raghuraman, Santa Clara, CA (US); David Erich Tetzlaff, Minnetonka, MN (US); Karlheinz Muth, Richardson, TX (US); Vivek Raghunathan, Mountain View, CA (US)

(73) Assignee: Rockley Photonics Limited, Oxford (GB)

( * ) Notice: Subject to any disclaimer, the term of this patent is extended or adjusted under 35 U.S.C. 154(b) by 424 days.

(21) Appl. No.: 16/383,309

(22) Filed: Apr. 12, 2019

(65) Prior Publication Data

US 2019/0243164 A1 Aug. 8, 2019

Related U.S. Application Data

(63) Continuation-in-part of application No. 15/982,928, filed on May 17, 2018, now Pat. No. 10,423,016.

(60) Provisional application No. 62/656,748, filed on Apr. 12, 2018, provisional application No. 62/510,211, filed on May 23, 2017.

(51) Int. Cl.
| | |
|---|---|
| *G02F 1/01* | (2006.01) |
| *H03F 1/32* | (2006.01) |
| *H04B 10/50* | (2013.01) |
| *H04B 10/588* | (2013.01) |
| *H03F 3/217* | (2006.01) |
| *H03F 3/24* | (2006.01) |

(Continued)

(52) U.S. Cl.
CPC .......... *G02F 1/0121* (2013.01); *H03F 1/3241* (2013.01); *H03F 3/217* (2013.01); *H03F 3/245* (2013.01); *H03K 17/687* (2013.01); *H04B 10/505* (2013.01); *H04B 10/588* (2013.01); *H03K 19/20* (2013.01)

(58) Field of Classification Search
CPC .... H04B 10/40; H04B 10/505; H04B 10/588; G02B 6/4274; G02B 6/13; G02B 6/4257; G02B 6/43; G02F 1/0121; G02F 1/17
See application file for complete search history.

(56) References Cited

U.S. PATENT DOCUMENTS

| | | |
|---|---|---|
| 8,781,267 B2 | 7/2014 | Julien et al. |
| 9,082,745 B2 | 7/2015 | Morris |

(Continued)

FOREIGN PATENT DOCUMENTS

| | | |
|---|---|---|
| KR | 10-2017-0073706 A | 6/2017 |
| WO | WO 2013/165344 A1 | 11/2013 |

(Continued)

OTHER PUBLICATIONS

U.S. Appl. No. 16/824,609, filed Mar. 19, 2020.

(Continued)

*Primary Examiner* — Brandi N Thomas
(74) *Attorney, Agent, or Firm* — Lewis Roca Rothgerber Christie LLP

(57) ABSTRACT

A system including an optical engine. In some embodiments, the system includes an integrated circuit in a first-level package, and the system includes the optical engine, in the first-level package, and the optical engine includes an electro-optical chip.

19 Claims, 2 Drawing Sheets

(51) Int. Cl.
*H03K 17/687* (2006.01)
*H03K 19/20* (2006.01)

(56) References Cited

U.S. PATENT DOCUMENTS

| | | | |
|---|---|---|---|
| 9,391,708 B2 | 7/2016 | Fincato et al. | |
| 9,490,240 B2 | 11/2016 | Lucero et al. | |
| 9,496,248 B2 | 11/2016 | Lee et al. | |
| 9,515,746 B2 | 12/2016 | Flens et al. | |
| 9,557,478 B2 | 1/2017 | Doerr et al. | |
| 9,575,267 B1 | 2/2017 | Shastri et al. | |
| 9,935,088 B2 | 4/2018 | Budd et al. | |
| 2012/0014639 A1* | 1/2012 | Doany | G02B 6/4202 385/14 |
| 2013/0308898 A1 | 11/2013 | Doerr et al. | |
| 2014/0064659 A1 | 3/2014 | Doerr et al. | |
| 2014/0203175 A1 | 7/2014 | Kobrinsky et al. | |
| 2014/0307569 A1* | 10/2014 | Barbieri | H04J 11/0043 370/252 |
| 2016/0013866 A1 | 1/2016 | Doerr | |
| 2016/0124164 A1 | 5/2016 | Doerr | |
| 2019/0243066 A1 | 8/2019 | Mahgerefteh et al. | |

FOREIGN PATENT DOCUMENTS

| | | | |
|---|---|---|---|
| WO | WO 2014/014846 A2 | 1/2014 | |
| WO | WO 2016/077500 A8 | 5/2016 | |
| WO | WO 2020/083845 A1 | 4/2020 | |

OTHER PUBLICATIONS

U.S. Appl. No. 16/836,815, filed Mar. 31, 2020.
U.S. Office Action from U.S. Appl. No. 16/393,763, dated Mar. 18, 2020, 7 pages.
International Search Report and Written Opinion of the International Searching Authority, dated Sep. 23, 2019, Corresponding to PCT/IB2019/000382, 13 pages.
International Search Report and Written Opinion of the International Searching Authority, dated Sep. 30, 2019, Corresponding to PCT/IB2019/000383, 13 pages.
International Search Report and Written Opinion of the International Searching Authority, dated Oct. 9, 2019, Corresponding to PCT/IB2019/000607, 13 pages.
U.S. Appl. No. 16/382,076, filed Apr. 11, 2019.
U.S. Appl. No. 16/393,763, filed Apr. 24, 2019.
Website: "Silicon Wafer Integrated Fan-out Technology (SWIFT™) Packaging for Highly Integrated Products", Amkor, https://c44f5d406df450f4a66b-1b94a87d576253d9446df0a9ca62e142.ssl.cf2.rackcdn.com/2017/12/swift_Packaging_for_Highly_Integrated_Products_WhitePaper_0617.pdf, printed on Apr. 8, 2018, 4 pages.
U.K. Intellectual Property Office Examination Report, dated Jan. 19, 2022, for Patent Application No. GB2017782.0, 1 page.

* cited by examiner

OPTICAL ENGINE

CROSS-REFERENCE TO RELATED APPLICATION(S)

The present application claims priority to and the benefit of U.S. Provisional Application No. 62/656,748, filed Apr. 12, 2018, entitled "OPTICAL ENGINE", and the present application is a continuation-in-part of U.S. patent application Ser. No. 15/982,928, filed May 17, 2018, entitled "DRIVER FOR OPTICAL MODULATOR", which claims the benefit of U.S. Provisional Application No. 62/510,211, filed May 23, 2017. The entire contents of all of the applications identified in this paragraph are incorporated herein by reference.

FIELD

One or more aspects of embodiments according to the present disclosure relate to optical communications, and more particularly to an optical engine.

BACKGROUND

Higher density and reach in communication systems is requiring optical interconnects. Optical transceivers placed far away from a host or switch application-specific integrated circuit (ASIC) may be physically large, and consume significant amounts of power, in part because they are designed to communicate electrically, over a relatively large distance, with the host or switch ASIC. This may limit the system density in 12, 25 and 50 Tb/s systems.

Thus, there is a need for an improved optical engine.

SUMMARY

According to some embodiments there is provided a system, including: a first integrated circuit in a first-level package; and an optical engine, in the first-level package, the optical engine including a first electro-optical chip.

In some embodiments, the optical engine further includes: a second integrated circuit including a first analog circuit for interfacing to the first electro-optical chip.

In some embodiments: the first electro-optical chip includes a photodetector; the optical engine further includes a second electro-optical chip including an optical modulator; and the second integrated circuit further includes a second analog circuit for interfacing to the optical modulator.

In some embodiments, the first analog circuit is a linear modulator driver, and the second analog circuit is a transimpedance amplifier.

In some embodiments, the second integrated circuit further includes a retiming circuit.

In some embodiments, the second integrated circuit further includes a physical coding sublayer circuit.

In some embodiments, the optical engine is connected to a substrate of the first-level package through a reworkable interface.

In some embodiments, the reworkable interface is a socketed interface.

In some embodiments, the second integration circuit includes an equalization circuit.

In some embodiments, the first electro-optical chip includes an optical PAM-4 modulator configured to driven by a two-bit control signal.

In some embodiments, the system includes: a plurality of optical engines including the optical engine; and a management circuit, configured to manage the plurality of optical engines.

In some embodiments, the optical engine is configured to exchange data with the first integrated circuit at a first symbol rate, and an electrical connection between the optical engine exhibits a loss of less than 10 dB at a Nyquist frequency corresponding to the first symbol rate.

In some embodiments, the system includes an enclosure having a front panel, the first-level package being in the enclosure, the system further including a front panel package including a laser connected through an optical fiber to the first-level package.

In some embodiments, the front panel package has a QSFP-DD or OSFP-DD form factor and the optical fiber connects a first interface of the front panel package to the first-level package, the first interface being on the outside of the front panel.

In some embodiments, the first integrated circuit is a packet-switching digital integrated circuit.

BRIEF DESCRIPTION OF THE DRAWINGS

These and other features and advantages of the present disclosure will be appreciated and understood with reference to the specification, claims, and appended drawings wherein:

DETAILED DESCRIPTION

The detailed description set forth below in connection with the appended drawings is intended as a description of exemplary embodiments of an optical engine provided in accordance with the present disclosure and is not intended to represent the only forms in which the present disclosure may be constructed or utilized. The description sets forth the features of the present disclosure in connection with the illustrated embodiments. It is to be understood, however, that the same or equivalent functions and structures may be accomplished by different embodiments that are also intended to be encompassed within the scope of the disclosure. As denoted elsewhere herein, like element numbers are intended to indicate like elements or features.

Figure 1:
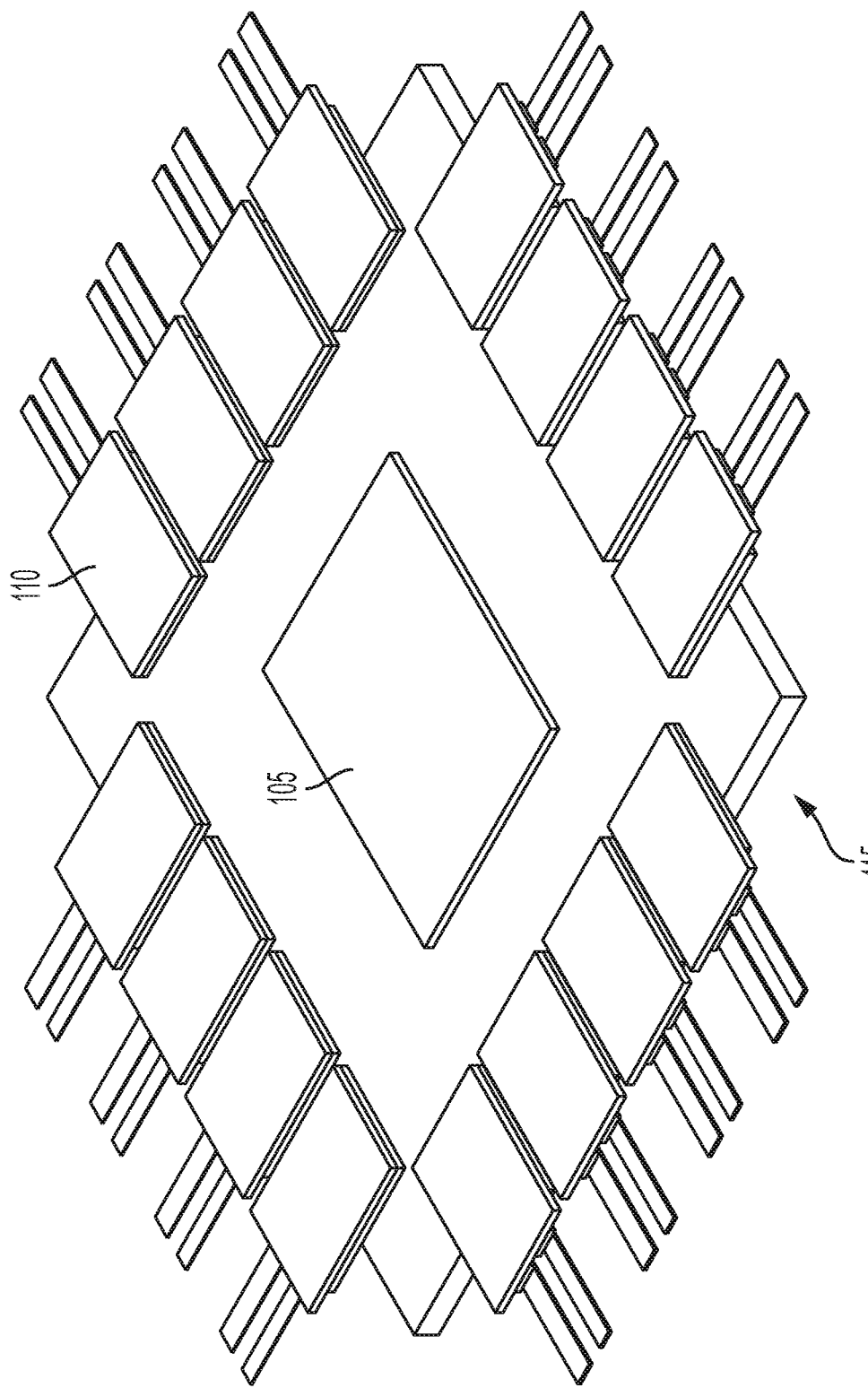
FIG. 1 is a perspective view of a first-level package, according to an embodiment of the present disclosure.

Referring to FIG. 1, a first-level package 115 including a switch ASIC 105 (e.g., a CMOS packet-switching digital integrated circuit), and a plurality of optical engines 110, in or on the first-level package 115, as described in further detail below, may overcome some shortcomings of systems in which transceivers are more distant from a host or switch ASIC 105. The electrical connections between each optical engine 110 and the switch ASIC may be sufficiently short to significantly simply the circuitry on both ends of those connections. In some embodiments each connection is shorter than 10 mm, e.g., shorter than 5 mm. In some embodiments the interfaces between the optical engines 110 and the switch ASIC 105 employ (electrical) PAM-4 signaling. In some embodiments, each optical engine is configured to exchange data with the switch ASIC 105 at a first symbol rate (e.g., 25 giga-symbols per second (GS/s), 50 GS/s or 100 GS/s (corresponding to PAM-4 at 50 Gb/s, 100 Gb/s, and 200 Gb/s, respectively (PAM-4 being four-level pulse-amplitude modulation)) and the electrical connections are sufficiently short (e.g., 40 mm, 20 mm, or 15 mm, respectively) to exhibit a loss of less than 4 dB (in a connection without retiming, or a loss of less than 8 dB or 10 dB in a connection with retiming) at a respective Nyquist frequency (i.e., twice the symbol rate).

The optical engines 110 may be connected to the substrate of the first-level package using a reworkable (or pluggable) interface, e.g., a socket. This reworkable interface may make it possible to easily replace an optical engine 110 (which may be costly) individually with a new one if one fails, or to replace an optical engine with a different kind of optical engine (e.g., one having different optical characteristics or different electrical functionality). The high speed routing from the optical engines 110 to the switch ASIC 105 can be limited to the top layers of a standard 5-2-5/4-2-4 organic BGA substrate. This (i) allows a superior high speed performance by avoiding lossy transitions through the core of the substrate, and (ii) may enable a large form factor substrate (to support, e.g., 16 optical engines) and a larger core.

Figure 2:
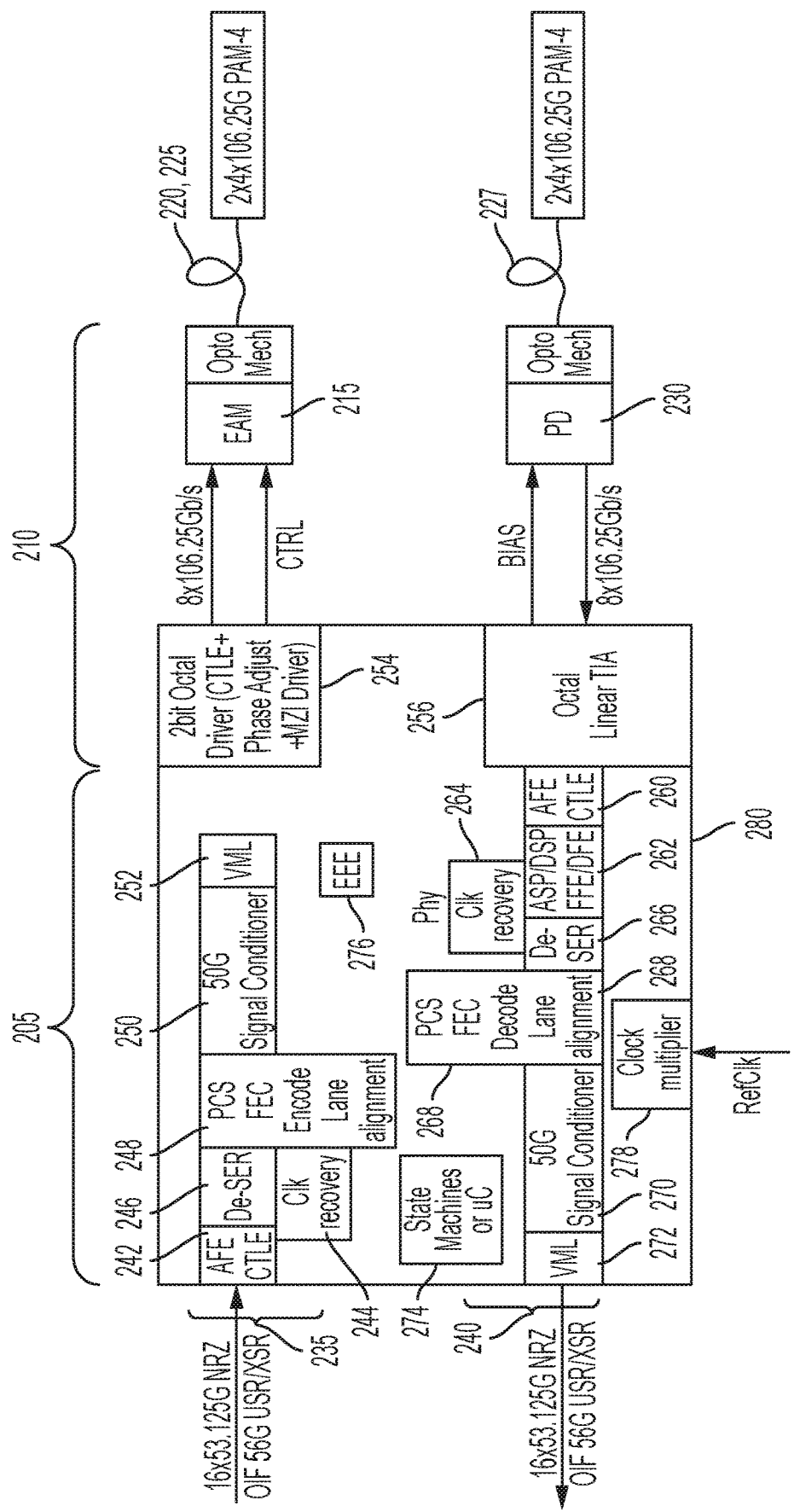
FIG. 2 is a block diagram of an optical engine, according to an embodiment of the present disclosure.

FIG. 2 is a block diagram of an optical engine, in some embodiments. The optical engine may include a physical layer (Phy) circuit 205 and an optical interface 210. The optical interface 210 may include an array of modulators 215 (each of which may be an electro-absorption modulator (EAM), or another type of modulator, such as a Mach-Zehnder modulator, a ring modulator, or a polymer modulator) coupled to a first array of optical fibers 220 for receiving unmodulated laser light, and coupled to a second array of optical fibers 225 for transmitting modulated light. The optical interface may further include an array of photodetectors (PD) 230 coupled to a corresponding third array of optical fibers 227 for receiving modulated light.

The Phy circuit 205 includes a transmitting portion (or "Phy transmitter") 235 and a receiving portion (or "Phy receiver") 240. The transmitting portion 235 of the Phy circuit 205 (the upper portion, in FIG. 2) includes an analog front end (AFE) 242 for receiving a signal from the switch ASIC 105. The signal may be carried, for example, on a plurality of (e.g., 16) serial connections, each operating at 53.125 Gb/s (or "53.125 G"), and each implementing a low complexity interface, such as NRZ, over very simple short reach industry standardized interfaces such as ultra short reach (USR) or extra short reach (XSR). Such use of a low complexity interface between the switch ASIC 105 and the Phy circuit 205 (both in the transmitting and in the receiving direction (discussed below)) may significantly simplify the circuitry required in the switch ASIC 105, thereby reducing power consumption in the switch ASIC 105, or making die area in the switch ASIC 105 available for other functions, or both. Clock recovery for the signal received from the switch ASIC 105 may be performed by a clock recovery circuit 244 on the output of the analog front end of the Phy receiver 240.

A deserializer (De-SER) (or "deserializing circuit") 246 converts the received signal to lower-speed signals at greater bus width. From the output of the deserializer 246, a circuit 248 including a physical coding sublayer (PCS) circuit, a forward error correction (FEC) encoding circuit, and a lane alignment circuit (or one or more circuits each performing combinations of one or more of these functions) produces a parallel output data stream which is converted to a smaller number of higher data rate data streams by a 50 G signal conditioner 250. A voltage-mode logic (VML) driver circuit 252 receives the output of the 50 G signal conditioner and drives an octal driver circuit 254 (e.g., a circuit including eight similar or identical driver circuits), that is connected to the transmitting portion 235 of the Phy circuit 205, and that generates signals suitable for producing, in each of the modulators, PAM-4 modulation. The octal driver circuit may include, for example, a circuit disclosed in U.S. Patent Application Publication No. 2018/0341125, which is incorporated herein by reference. In some embodiments, the transmitted optical signal includes 2×4 (i.e., eight) data streams (e.g., two fibers, each carrying four wavelengths, or four fibers, each carrying two wavelengths) each data stream having a data rate of 106.25 G (i.e., 106.25 Gb/s, or 53.125 symbols per second, each symbol being a PAM-4 symbol carrying two bits).

The receiving portion 240 of the Phy circuit 205 (the lower portion, in FIG. 2) is connected to an octal linear transimpedance amplifier (TIA) 256 (e.g., a circuit including eight similar or identical transimpedance amplifier circuits) which receives signals from corresponding photodetectors 230, each coupled to a fiber of the third array of optical fibers 227. In some embodiments, the received optical signal includes, like the transmitted optical signal, 2×4 data streams, each data stream having a data rate of 106.25 G. The output of the TIA 256 is received by an analog front end 260 including a continuous time linear equalization (CTLE) circuit, which feeds an analog signal processing (ASP)/digital signal processing (DSP) circuit (or an "analog and digital signal processing circuit") 262 providing feed-forward equalization (FFE) or decision feedback equalization (DFE), or both. Clock recovery is performed on the signal, by a clock recovery circuit 264, and it is deserialized by a deserializer (De-SER) 266. A circuit 268 including a physical coding sublayer (PCS) circuit, a forward error correction (FEC) decoding circuit, and a lane alignment circuit (or one or more circuits each performing combinations of one or more of these functions) produces a parallel data stream which is converted to a smaller number of higher data rate data streams by a 50 G signal conditioner 270, which feeds a voltage-mode logic (VML) driver circuit 272 that drives corresponding inputs of the switch ASIC 105. On the receiving side (as on the transmitting side) the use of a low complexity interface between the switch ASIC 105 and the Phy circuit 205 may significantly simplify the circuitry required in the switch ASIC 105 and in the Phy circuit 205.

The Phy circuit 205 may further include a control circuit 274 which may include a set of state machines or a microcontroller (uC), and an energy efficient Ethernet (EEE) circuit 276 which may switch certain elements of the integrated circuit 280 on or off, depending on the load, to save power. The Phy circuit 205, the octal driver circuit 254, and the octal linear transimpedance amplifier (TIA) 256 may all be part of an integrated circuit (e.g., a "second integrated circuit") 280, which may be a single complementary metal oxide semiconductor (CMOS) integrated circuit.

As mentioned above, the electrical connections between the Phy circuit and the switch ASIC may be relatively short, e.g., less than 25 mm in length (or less than 1 mm in length). Some embodiments not only make it unnecessary for the switch ASIC 105 to include the relatively complex circuits that would be needed if the switch ASIC 105 were connected to state of the art optical frontplane transceivers over relatively long electrical high-speed serial data links, but make it possible to eliminate such circuits from the system entirely, because in some embodiments long electrical high-speed serial data links are not used.

In some embodiments, an external reference clock signal (at, e.g., 100 MHz) is fed into the Phy circuit 205, within which it is multiplied up (by a clock frequency multiplying circuit 278) and used for retiming of the signals at the output (to the octal driver circuit) of the transmitting portion of the Phy circuit and at the output (to the switch ASIC) of the receiving portion of the Phy circuit. The same reference clock signal may also be fed to the switch ASIC, and used to clock in serial data from the Phy circuit. This arrangement may make it unnecessary for the switch ASIC to include an array of voltage controlled oscillators (VCOs) (e.g., inductor-capacitor VCOs (LC VCOs)) for clocking in serial data from the Phy circuit.

In some embodiments, portions of the second integrated circuit 280 may be absent, or the second integrated circuit 280 may be absent entirely. For example, the second integrated circuit 280 may, if present, perform only analog functions on the high speed signal path (e.g., amplifying signals from the photodetectors 230 and amplifying drive signals for the modulators 215) or it may perform only analog functions and retiming. In some such embodiments, the second integrated circuit 280 includes only analog interface circuits on the high speed signal path, e.g., it includes analog interface circuits (e.g., linear drivers) for interfacing to the modulators 215 and analog interface circuits (e.g., linear transimpedance amplifiers) for interfacing to the photodetectors 230, and simple digital configuration circuits, e.g., for setting the amplitudes of modulator drivers, and for setting the loss of signal detector thresholds in the transimpedance amplifiers. In some embodiments, the second integrated circuit 280 further includes only a retiming circuit, including, e.g., the clock recovery circuit 244 of the transmitting portion 235 and the clock recovery circuit 264 of the receiving portion 240. In some embodiments, the second integrated circuit 280 may further include a physical coding sublayer circuit (including some or all of the remaining elements shown in FIG. 2) and as a result the second integrated circuit 280 may be capable of performing lane alignment, of performing forward error correction, and of assigning lane numbers. In various embodiments (e.g., with or without a retiming circuit, and with or without a physical coding sublayer circuit), the second integrated circuit 280 may include one or more equalization circuits (such as the continuous time linear equalization (CTLE) circuit of the analog front end 260).

In some embodiments, each of the modulators 215 is a simple modulator, and each of the driver circuits 254 for the modulators may apply four different voltages to (or drive four different currents through) a respective modulator 215, to produce PAM-4 modulation. In other embodiments each of the modulators 215 is an optical PAM-4 modulator (e.g., a composite modulator that may include a cascade of independently controllable modulators (e.g., a cascade of two, three, or four electro-absorption modulators)) configured to be driven by a two-bit control signal (e.g., a two-bit NRZ control signal) to produce the four distinct attenuation levels corresponding to PAM-4 modulation.

In some embodiments a management circuit outside of the second integrated circuit 280 may manage a plurality of optical engines 110 (e.g., it may manage a plurality of second integrated circuits 280, each in a respective one of the plurality of optical engines 110). Such a management circuit may be a third integrated circuit (inside or outside of the first-level package) or it may be part of the first integrated circuit (the switch ASIC 105). The management circuit may be connected to the control circuits 274 in the optical engines 110 and it may manage the optical engines by, e.g., configuring chips, reporting loss of signal, reporting configuration, detecting faults, and performing status reporting. The use of a single circuit to manage a plurality of optical engines 110 may make it unnecessary for the second integrated circuit 280 to provide this functionality.

In some embodiments the first-level package is (e.g., on a printed circuit board) in an enclosure having a front panel (which may be a front panel of a rack-mount card in the enclosure), and lasers for supplying unmodulated light to the modulators 215 are installed in industry-standard form factor (e.g., QSFP-DD or OSFP-DD form factor) front panel packages in the front panel. Such an industry-standard form factor package may have a fiber interface on the outside of the front panel; a fiber loopback may be used to guide light from a laser in the front panel package back into the enclosure and to the first-level package, where it may supply light to the optical engines 110 (i.e., to the modulators 215 in the optical engines 110).

As used herein, an electro-optical chip is a semiconductor chip (such as one of the photodetectors 230) configured to convert optically transmitted data to electrically transmitted data, or a semiconductor chip (such as one of the modulators 215) configured to convert electrically transmitted data to optically transmitted data. Optically transmitted data may be, for example, light that is amplitude modulated (e.g., with PAM-4 modulation) and that carries data as a result. Similarly, electrically transmitted data may be time-varying voltages or currents carrying data. As used herein, a first-level package is a package having a substrate and containing one or more integrated circuit die connected to the substrate. The integrated circuit die may be directly connected to the substrate (e.g., wire-bonded to the substrate, or flip-chip mounted on the substrate), or it or they may be indirectly mounted on the substrate (e.g., it or they may be wire bonded to a redistribution layer that is in turn directly mounted on the substrate). The first-level package may be suitable for installation on a printed circuit board, e.g., directly (e.g., the substrate may have a ball grid array on its lower surface allowing it to be installed on the printed circuit board using a reflow process) or indirectly (e.g., it may be included in a second-level package that may be installed on the printed circuit board). As used herein, the word "or" is inclusive, so that, for example, "A or B" means any one of (i) A, (ii) B, and (iii) A and B.

Although exemplary embodiments of an optical engine have been specifically described and illustrated herein, many modifications and variations will be apparent to those skilled in the art. Accordingly, it is to be understood that an optical engine constructed according to principles of this disclosure may be embodied other than as specifically described herein. The invention is also defined in the following claims, and equivalents thereof.

What is claimed is:

1. A system, comprising:
    a first integrated circuit in a first-level package; and
    an optical engine, in the first-level package,
    the optical engine comprising a first electro-optical chip,
    wherein the optical engine is configured to exchange data with the first integrated circuit at a first symbol rate, and
        an electrical connection between the optical engine and the first integrated circuit exhibits a loss of less than 10 dB at a Nyquist frequency corresponding to the first symbol rate.

2. The system of claim 1, wherein the optical engine further comprises:
    a second integrated circuit comprising a first analog circuit for interfacing to the first electro-optical chip.

3. The system of claim 2, wherein:
    the first electro-optical chip comprises a photodetector;
    the optical engine further comprises a second electro-optical chip comprising an optical modulator; and the second integrated circuit further comprises a second analog circuit for interfacing to the optical modulator.

4. The system of claim 3, wherein the first analog circuit is a linear modulator driver, and the second analog circuit is a transimpedance amplifier.

5. The system of claim 2, wherein the second integrated circuit further comprises a retiming circuit.

6. The system of claim 5, wherein the second integrated circuit further comprises a physical coding sublayer circuit.

7. The system of claim 2, wherein the optical engine is connected to a substrate of the first-level package through a reworkable interface.

8. The system of claim 7, wherein the reworkable interface is a socketed interface.

9. The system of claim 2, wherein the second integration circuit comprises an equalization circuit.

10. The system of claim 2, wherein the first electro-optical chip comprises an optical PAM-4 modulator configured to driven by a two-bit control signal.

11. The system of claim 2, comprising:
a plurality of optical engines including the optical engine; and
a management circuit, configured to manage the plurality of optical engines.

12. The system of claim 2, comprising an enclosure having a front panel, the first-level package being in the enclosure, the system further comprising a front panel package comprising a laser connected through an optical fiber to the first-level package.

13. The system of claim 12, wherein the front panel package has a QSFP-DD or OSFP-DD form factor and the optical fiber connects a first interface of the front panel package to the first-level package, the first interface being on the outside of the front panel.

14. The system of claim 2, wherein the first integrated circuit is a packet-switching digital integrated circuit.

15. The system of claim 1, wherein the first electro-optical chip comprises an optical PAM-4 modulator configured to driven by a two-bit control signal.

16. The system of claim 1, comprising:
a plurality of optical engines including the optical engine; and
a management circuit, configured to manage the plurality of optical engines.

17. The system of claim 1, comprising an enclosure having a front panel, the first-level package being in the enclosure, the system further comprising a front panel package comprising a laser connected through an optical fiber to the first-level package.

18. The system of claim 17, wherein the front panel package has a QSFP-DD or OSFP-DD form factor and the optical fiber connects a first interface of the front panel package to the first-level package, the first interface being on the outside of the front panel.

19. The system of claim 1, wherein the first integrated circuit is a packet-switching digital integrated circuit.

\* \* \* \* \*